United States Patent

Onodera

[19]

[11] Patent Number: 5,875,505
[45] Date of Patent: *Mar. 2, 1999

[54] APPARATUS FOR CLEANING AND DRYING HARD DISK SUBSTRATES

[75] Inventor: Masami Onodera, Niigata, Japan

[73] Assignee: System Seiko Co., Ltd., Niigata, Japan

[*] Notice: The term of this patent shall not extend beyond the expiration date of Pat. No. 5,685,040.

[21] Appl. No.: 917,829

[22] Filed: Aug. 27, 1997

Related U.S. Application Data

[63] Continuation of Ser. No. 141,714, Oct. 26, 1993, Pat. No. 5,685,040, which is a continuation of Ser. No. 23,753, Feb. 25, 1993, abandoned, which is a continuation of Ser. No. 797,861, Nov. 26, 1991, abandoned.

[51] Int. Cl.⁶ ................................................ B08B 11/02
[52] U.S. Cl. ............................................. 15/97.1; 15/88.2
[58] Field of Search ..................... 15/88.2, 88.3, 15/88.4, 97.1, 77, 102; 134/902

[56] References Cited

U.S. PATENT DOCUMENTS 5,092,011   3/1992   Gommori et al. .

*Primary Examiner*—Randall E. Chin
*Attorney, Agent, or Firm*—McDermott, Will & Emery

[57] ABSTRACT

A substrate cleaning station includes a first index table supporting thereon at least three circumferentially spaced first substrate carriers on which hard disk substrates are mounted respectively. A substrate drying station includes a second index table disposed rearward of the first index table and supporting thereon at least three circumferentially spaced second substrate carriers on which cleaned hard disk substrate are mounted, respectively. Upon rotation of the first index table, each of the first substrate carriers moves successively through a substrate mounting position, a substrate cleaning position and a substrate removing position. Likewise, upon rotation of the second index table, each of the second substrate carriers moves through a substrate mounting position, a substrate drying position and a substrate removing position.

2 Claims, 2 Drawing Sheets

5,875,505

APPARATUS FOR CLEANING AND DRYING HARD DISK SUBSTRATES

This application is a Continuation of application Ser. No. 08/141,714 filed Oct. 26, 1993, now U.S. Pat. No. 5,685,040 which is a Continuation of U.S. Ser. No. 08/023,753, filed Feb. 25, 1993 now abandoned which is a Continuation of U.S. Ser. No. 07/797,861, filed Nov. 26, 1991, now abandoned.

BACKGROUND OF THE INVENTION

1. Field of the Invention

The present invention relates to an apparatus for cleaning and then drying the substrate of hard disks used in electronic equipment such as computers.

2. Description of the Prior Art

In recent years, with an increasing tendency to use hard disk drives in electronic equipment such as computers, the demand for quick, low cost production of such devices has increased.

As is well known, the substrate of a hard disk (often referred to simply as "substrate") must be cleaned and then dried after lapping and polishing are completed.

In a previously proposed substrate cleaning and drying machine used heretofore, a single substrate is fed into the machine and after cleaning and drying operations are completed, the substrate is removed from the machine and the next substrate is fed in. Following this, the foregoing cycle of operation is repeated. In other words, the substrates are loaded, cleaned, dried and removed, one at a time.

Accordingly, the prior cleaning and drying apparatus exhibits a relatively long processing time and hence a relatively low processing efficiency.

SUMMARY OF THE INVENTION

It is an object of the present invention to provide an apparatus which can continuously clean and then dry batches of hard disk substrates in a short period of time and at a low cost.

In brief, a cleaning and drying apparatus of this invention is constructed such that a plurality of hard disk substrates (viz., a substrate batch) is fed in succession into a substrate cleaning station. After the cleaning operation is performed, the cleaned substrates are fed successively into a substrate drying station. When the drying is completed the substrates are removed successively; from the apparatus.

More specifically, a first aspect of this invention resides in an apparatus for cleaning and then drying hard disk substrates, which comprises a substrate cleaning station; a substrate drying station disposed rearward of said substrate cleaning station; at least three substrate carriers, provided in said substrate cleaning station, moving successively through a substrate mounting position, a substrate cleaning position, and a substrate removing position; and at least three substrate carriers, provided in said substrate drying station, moving successively through a substrate mounting position, a substrate drying position, and a substrate removing position.

The above apparatus further comprises a substrate transfer means for successively transferring a plurality of hard disk substrates from said substrate removing position of said substrate cleaning station to said substrate mounting position of said substrate drying station.

A second aspect of this invention resides in a method of successively cleaning and then drying a plurality of hard disk substrates, which comprises the steps of: (a) receiving a substrate at a substrate cleaning station; (b) moving the substrate to a substrate cleaning position of said substrate cleaning station; (c) advancing the substrate to a substrate removing position of said substrate cleaning position; (d) receiving, at a substrate drying station, the substrate from said substrate removing position of said substrate cleaning station; (e) moving the substrate to a substrate drying position of said substrate drying station; and (f) advancing the substrate to a substrate removing position of said substrate drying station.

The above and other objects, features and advantages of the present invention will become more apparent from the following description when making reference to the detailed description and the accompanying sheets of drawings in which a preferred structural embodiment incorporating the principles of the present invention is shown by way of illustrative example.

DETAILED DESCRIPTION OF THE INVENTION

Figure 1:
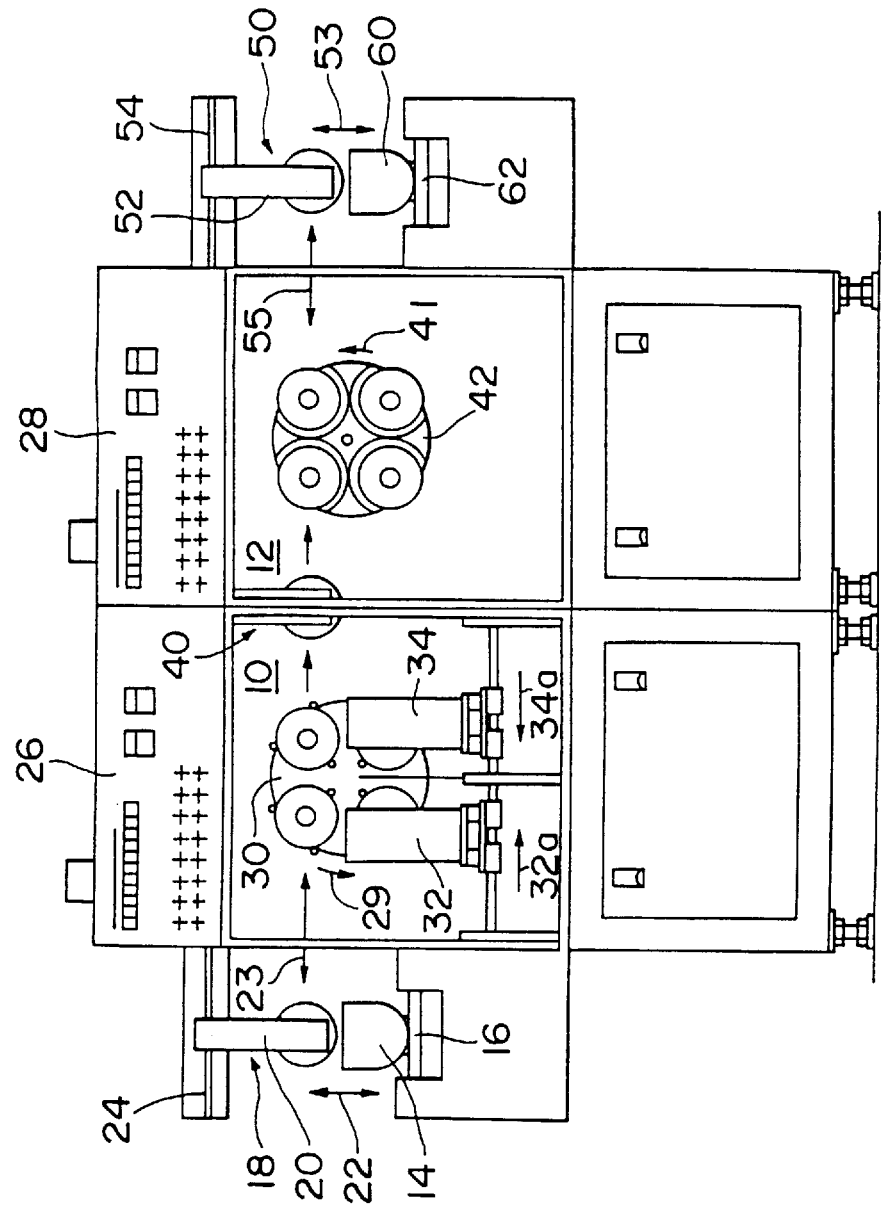
FIG. 1 is a diagrammatical front elevational view of an apparatus for cleaning and then drying hard disk substrates according to the present invention.

FIG. 1 diagrammatically shows the general construction of a hard disk substrate cleaning and drying apparatus according to this invention. The apparatus includes a substrate cleaning station 10 and a substrate drying station 12 which are disposed side by side. Numeral 14 denotes a magazine for receiving a plurality of substrates which require cleaning and drying in the substrate cleaning and drying stations 10 and 12. A plurality of such magazines 14 are arranged in a row and are disposed on a magazine conveying means or conveyor 16 movable in a direction perpendicular to the plane of the drawing sheet. Numeral 18 denotes a substrate loading means for taking the substrates one at a time from the magazine 14 which is located in a substrate supply position shown in FIG. 1 and then loading or supplying the same into the substrate cleaning station 10 of the apparatus. The substrate loading means 18 includes a grip arm 20 which is vertically movable as indicated by an arrow 22 and which is arranged to pick up one substrate at a time from the substrate magazine 14; and a horizontal rail 24 along which the loading arm 20 is reciprocally movable in the direction indicated by an arrow 23, so as to transfer the substrate to the substrate cleaning station 10. Numerals 26 and 28 denote control panels for controlling the operation of the substrate cleaning station 10 and the substrate drying station 12, respectively.

The substrate cleaning station 10 includes a vertical index table 30 which is intermittently rotatable in the direction indicated by an arrow 29; a plurality (four in the illustrated embodiment) of substrate carriers (described later with reference to FIG. 2) and first and second substrate cleaning units 32, 34. The first and second substrate cleaning units 32, 34 each includes a pair of cleaning pads and two cleaning rollers, as will become apparent later.

Each of the substrate cleaning units 32 and 34 is horizontally movable between a cleaning position shown in FIG. 1 and a standby position wherein the units are spaced laterally from the cleaning position. The substrate cleaning units 32, 34 are normally disposed in the standby position and when the cleaning operation starts, they are moved forward into the working position, as indicated by arrows 32a and 34a. After the cleaning operation in the substrate cleaning station 10 is completed, the cleaned substrates are taken from the substrate cleaning station 10 one at a time and transferred into the substrate drying station 12 by means of a substrate transfer means or mechanism 40.

The substrate drying station 12 includes a vertical index table 42 intermittently rotatable in the direction of an arrow 41, and a plurality (four in the illustrated embodiment) of substrate carriers, described later with reference to FIG. 2. The substrates which are dried in the drying station are removed one by one from the substrate drying station 12 and then unloaded into a magazine 60 by means of a substrate unloading means 50.

The substrate unloading means 50 includes a grip arm 52 and a horizontal rail 54 along which the grip arm 52 is reciprocally movable in the direction indicated by an arrow 55. This arm picks up one substrate at a time from the substrate drying station 12 and transfers the same into a position directly above the magazine 60 which is disposed in a substrate receiving position shown in FIG. 1. The grip arm 52 is also vertically movable as indicated by an arrow 53 to enable the substrate to be lowered into the magazine 60. A plurality of magazines 62 are provided and are disposed on a magazine conveying means or conveyor 62. The magazine conveyor 60 is movable in a direction perpendicular to the plane of the sheet of the drawing and is arranged to convey a row of magazines 60 into a subsequent processing station in which the cleaned and dried substrates are disposed in hard disk cassettes.

Figure 2:
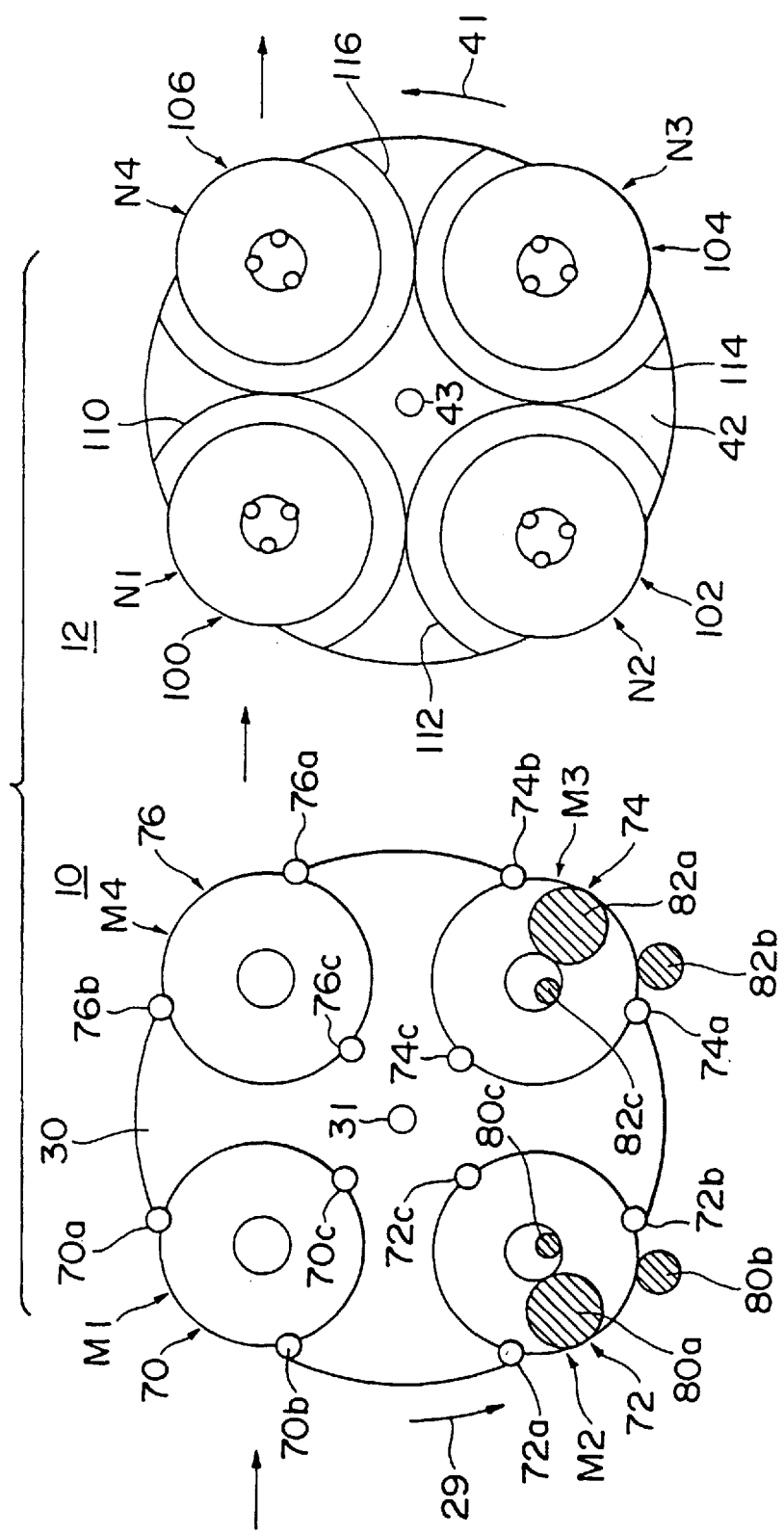
FIG. 2 is an enlarged detail view of a vital part of the apparatus shown in FIG. 1.

As shown in FIG. 2, the substrate cleaning station 10 includes the above-mentioned index table 30 which is intermittently rotatable about a shaft 31 in the direction indicated by the arrow 29, preferably in synchronism with intermittent rotation of the index table 42 of the substrate drying station 12. In the illustrated embodiment, four substrate carriers 70, 72, 74 and 76 are disposed on the index table 30 and circumferentially spaced at equal angular intervals.

Each of the substrate carriers 70–76 includes three substrate holders 70a, 70b, 70c; 72a, 72b, 72c; 74a, 74b, 74c; and 76a, 76b, 76c which are circumferentially spaced at equal angular intervals and which cooperate with each other to rotatably support an outer peripheral edge of the substrate. In FIG. 2, the substrate carriers 70, 72, 74 and 76 are disposed in a substrate mounting position M1, a first cleaning position M2, a second cleaning position M3, and a substrate removing position M4, respectively.

FIG. 2 also illustrates an internal construction of the first and second cleaning units 32, 34 shown in FIG. 1. The first cleaning unit 32 includes three cleaning members 80a, 80b and 80c. The first cleaning member 80a is composed of a pair of rotating pad-like cleaning elements, such as sponge pads, which are disposed on opposite sides of the substrates and which are frictionally engageable with the opposite sides of the substrate for cleaning the opposite sides of the same. In this figure only the sponge pad disposed on the front side of the substrate is illustrated. The second and third cleaning members 80b and 80c are cleaning rollers frictionally engageable with an inner and outer peripheral edge of the substrate for cleaning these edges. Likewise, the second cleaning unit 34 is composed of three cleaning members 82a, 82b and 82c which correspond in construction and operation to the cleaning members 80a, 80b and 80c of the first cleaning unit 32, and hence a further description will be omitted. As the substrate is cleaned on its opposite sides by two confronting pad-like cleaning members (only one is shown and depicted by 80a), the substrate carriers 70–76 are constructed to hold the respective substrates in a space-apart relation to the front surface of the index table 30. The space between the substrates and the index table 30 is in the range of 10 to 15 cm, for example.

Operation of the apparatus performed at the substrate cleaning station 10 will be described below with reference to FIG. 2. Let it be assumed that the operation begins with the apparatus in a condition in which none of the substrate carriers 70–76 is supporting a substrate. The first substrate is picked up from the magazine 14 (FIG. 1) and then transferred to the substrate carrier 70 which is located at the substrate mounting position M1. In this instance, the substrate holders 70a, 70b, 70c are moved radially outwardly so that the first substrate can be disposed therebetween. Following this, the holders 70a, 70b, 70c are moved inwardly until they engage the outer peripheral edge of the substrate.

Then, the index table 30 is turned in the direction of the arrow 29 through an angle of 90 degrees. With this angular movement of the index table 30, the substrate carriers 70 and 76 are moved into the first cleaning position M2 and the substrate mounting portion M1, respectively. Subsequently, the next substrate (viz., the second substrate) is transferred to the substrate carrier 76 which is now located at the substrate mounting portion M1, in the same manner as with the first substrate described above. Upon arrival of the substrate carrier 70 at the first cleaning position M2, the first cleaning unit 32 is displaced from its standby position to the working position shown in FIG. 1 and the cleaning members 80a, 80b, 80c of the cleaning unit 32 are activated to perform a scrub cleaning operation using a neutral liquid detergent. In this instance, the rotating pad-like cleaning members 80a (only one being shown in FIG. 2) are brought into friction contact with the opposite sides of the substrate held on the substrate carrier 70. Since the substrate is rotatably supported by the substrate holders 70a, 70b & 70c, the substrate rotates about its own axis at the same time as the rotating pad-like cleaning members 80a are rotating about their own.

After the second substrate is mounted on the substrate carrier 76 located at the substrate mounting position M1, and after the first substrate which is supported on the substrate carrier 70 is cleaned at the cleaning position M2, the first cleaning unit 32 is displaced to its standby position wherein it is out of interference with the movement of the index table 30. Subsequently, the index table 30 turns again in the direction of the arrow 29 through an angle of 90 degrees. Accordingly, the index table 30 is conditioned such that three adjacent substrate carriers 70, 76 and 74 are located in the second cleaning position M3, the first cleaning position M2 and the substrate mounting position M1, respectively.

The second cleaning unit 34, having the same construction as the first cleaning unit 32 described above, performs an addition cleaning operation using tap or purified water. At this time, the first cleaning unit 32 is placed again into the working position and performs a scrub cleaning operation on the second substrate using the neutral detergent, while the substrate carrier 74 which is currently located in the substrate mounting position M1 receives a third substrate.

After the loading of the third substrate and the cleaning of the first and second substrates are completed, the index table 30 is further rotated in the direction of the arrow 29 through an angle of 90 degrees. With this angular movement of the index table 30, the substrate carriers 70, 76, 74 and 72 are disposed in the substrate removing position M4, the second cleaning position M3, the first cleaning position M2 and the substrate mounting position M1, respectively. The first substrate supported on the substrate carrier 70 is rinsed with a shower of pure water at the substrate removing position M4 and then removed from the substrate carrier 70 by means of the substrate transfer means 40, which in turn delivers the cleaned substrate into the drying station 12.

Thus, a series of substrates are sequentially cleaned at the substrate cleaning station 10 and subsequently delivered into the next following station, i.e., the substrate drying station 12.

The substrate drying station 12 includes the above-mentioned index table 42 which is intermittently rotatable about a shaft 43 in the direction indicated by an arrow 41. In the illustrated embodiment, four substrate carriers 100, 102, 104 and 106 are disposed on the index table 42 and circumferentially spaced at equal angular intervals about the shaft 43. In FIG. 2, the substrate carriers 100, 102, 104 and 106 are disposed in a substrate mounting position N1, a first drying position N2, a second drying position N3, and a substrate removing position N4, respectively. Each of the substrate carriers 100–106 is constructed to rotatably support a substrate at its inner peripheral edge.

Each substrate carrier 100–106 is provided with a spin motor (not shown) for enabling a spin drying operation of the substrates carried on the substrate carrier 100–106. Numerals 110, 112, 114 and 116 denote arcuate splash guards which extend around the respective substrate carriers 100–106 for preventing water on each substrate from splashing onto another substrate while the spin dry operation is being performed.

Operation of the apparatus performed at the substrate drying station 12 will be described below with reference to FIG. 2. For purposes of illustration, operation begins with the apparatus in the condition wherein none of the substrate carriers 100–106 is supporting a substrate.

A substrate (the first substrate) which is removed from the substrate removing position M4 of the substrate cleaning station 10 is transferred, by the substrate transferring means 40, to the substrate carrier 100 located at the substrate mounting position N1 of the substrate drying station 12.

Then, the index table 42 is turned in the direction of the arrow 41 through an angle of 90 degrees. With this angular movement of the index table 41, the substrate carriers 100, 102, 104 and 106 become positioned in the first drying position N2, the second drying position N3, the substrate removing position N4 and the substrate mounting position N1, respectively. Upon arrival of the substrate carrier 100 at the first drying position N2, the substrate carrier 100 is driven by the spin motor (not shown) to spin the first substrate at a high speed, thereby removing superfluous water. The drying operation performed in this manner is referred to as a spin dry operation. During this operation, the next substrate (the second substrate) is supplied to the substrate carrier 106 located at the substrate mounting portion N1, in the same manner as done with the first substrate as described above.

Subsequently, the index table 42 further turns in the direction of the arrow 41 through an angle of 90 degrees. This angular movement of the index table 42 brings the substrate carriers 100, 102, 104 and 106 in the second drying position N3, the substrate removing position N4, the substrate mounting position N1 and the first drying position N2, respectively. The first substrate located at the second drying position N3 is subjected to an additional spin dry operation. On the other hand, a third substrate is mounted on the substrate carrier 104 at the substrate mounting position N1, and the second substrate held on the substrate carrier 106 is subjected to a spin dry operation at the first drying position N2. In order to improve the efficiency of the dry spin operation, the first substrate may be continuously spun while the substrate carrier 100 moves from the first drying position N2 to the second drying position N3.

The index table 42 is then turned in the direction of the arrow 41 through an angle of 90 degrees. With this angular movement of the index table 42, the substrate carriers 100, 102, 104 and 106 are brought into the substrate removing position N4, the substrate mounting position N1, the first drying position N2 and the second drying position N3, respectively. The first substrate supported on the substrate carrier 100, now located at the substrate removing position N4, is removed from the drying station 12 by means of the substrate unloading means 50 (FIG. 1). During this process, a fourth substrate is supplied to the substrate carrier 102 at the substrate mounting position N1, the third substrate held on the substrate carrier 104 is subjected to a first spin dry operation, and the second substrate held on the substrate carrier 106 is subjected to a second spin dry operation.

Thus, a series of cleaned substrates which are successively supplied from the substrate cleaning station 10, are dried at the substrate drying station 12 and subsequently delivered into a subsequent processing station such as an assembling station in which the cleaned and dried substrates are disposed in hard disk cassettes.

In the embodiment described above with reference to FIGS. 1 and 2, each of the cleaning operation and drying operation is performed in two stages. However, the present invention is not limited to such a two-stage cleaning and drying operations. Instead, a single stage cleaning operation and a single stage drying operation may be used. In this instance, each of the index tables 30, 42 may support thereon three substrate carriers circumferentially spaced at equal angular intervals about its axis of rotation. As a further alternative, five or more substrate carriers may be disposed on each of the index tables 30, 42.

As appears clear from the foregoing description, according to the invention, batches of hard disk substrates are cleaned and then dried successively, so that the apparatus of this invention is able to considerably cut down a processing time which is required in the case of the conventional cleaning and drying apparatus.

Obviously, various minor changes and modifications of the present invention are possible in the light of the above teaching. It is therefore to be understood that within the scope of the appended claims the invention may be practiced otherwise than as specifically described.

What is claimed is:

1. An apparatus for cleaning and then drying hard disk substrates, comprising:

a substrate cleaning station;

a substrate drying station disposed rearward of said substrate cleaning station;

at least three substrate carriers, provided in said substrate cleaning station, moving successively through a substrate mounting position, a substrate cleaning position, and a substrate removing position; and at least three substrate carriers, provided in said substrate drying station, moving successively through a substrate mounting position, a substrate drying position, and a substrate removing position.

2. An apparatus as claimed in claim 1, further comprising substrate transfer means for successively transferring a plurality of hard disk substrates from said substrate removing position of said substrate cleaning station to said substrate mounting position of said substrate drying station.

* * * * *